United States Patent
Leung et al.

(10) Patent No.: US 9,530,681 B2
(45) Date of Patent: Dec. 27, 2016

(54) METHOD TO PROVIDE THE THINNEST AND VARIABLE SUBSTRATE THICKNESS FOR RELIABLE PLASTIC AND FLEXIBLE ELECTRONIC DEVICE

(71) Applicant: STMicroelectronics Pte Ltd, Singapore (SG)

(72) Inventors: Calvin Leung, Singapore (SG); Olivier Le Neel, Singapore (SG)

(73) Assignee: STMICROELECTRONICS PTE. LTD., Singapore (SG)

( * ) Notice: Subject to any disclaimer, the term of this patent is extended or adjusted under 35 U.S.C. 154(b) by 0 days.

(21) Appl. No.: 14/986,130

(22) Filed: Dec. 31, 2015

(65) Prior Publication Data

US 2016/0118289 A1    Apr. 28, 2016

Related U.S. Application Data

(62) Division of application No. 14/090,673, filed on Nov. 26, 2013, now Pat. No. 9,257,423.

(51) Int. Cl.

| | | |
|---|---|---|
| H01L 21/683 | (2006.01) | |
| H01L 21/768 | (2006.01) | |
| H01L 27/06 | (2006.01) | |
| H01L 23/498 | (2006.01) | |
| H01L 23/538 | (2006.01) | |
| H01L 23/31 | (2006.01) | |
| H01L 21/56 | (2006.01) | |
| H01L 21/48 | (2006.01) | |
| H01L 23/00 | (2006.01) | |
| H01L 27/105 | (2006.01) | |
| H01L 49/02 | (2006.01) | |
| H01L 29/66 | (2006.01) | |

(52) U.S. Cl.
CPC ....... *H01L 21/6835* (2013.01); *H01L 21/4846* (2013.01); *H01L 21/568* (2013.01); *H01L 21/76895* (2013.01); *H01L 23/3135* (2013.01); *H01L 23/4985* (2013.01); *H01L 23/49822* (2013.01); *H01L 23/5389* (2013.01); *H01L 24/20* (2013.01); *H01L 27/0629* (2013.01); *H01L 27/1052* (2013.01); *H01L 28/60* (2013.01); *H01L 29/6675* (2013.01); *H01L 2221/68345* (2013.01); *H01L 2221/68359* (2013.01); *H01L 2224/18* (2013.01); *H01L 2924/0002* (2013.01)

(58) Field of Classification Search
CPC .............. H01L 27/0629; H01L 21/568; H01L 23/3135; H01L 23/5389; H01L 23/49822; H01L 21/76895; H01L 2224/18; H01L 21/6835

See application file for complete search history.

(56) References Cited

U.S. PATENT DOCUMENTS 8,693,711 B2    4/2014 Ho et al.

*Primary Examiner* — David Vu

(74) *Attorney, Agent, or Firm* — Seed IP Law Group LLP

(57) ABSTRACT

An electronic device is formed by depositing polyimide on a glass substrate. A conductive material is deposited on the polyimide and patterned to form electrodes and signal traces. Remaining portions of the electronic device are formed on the polyimide. A second polyimide layer is then formed on the first polyimide layer. The glass substrate is then removed, exposing the electrodes and the top surface of the electronic device.

20 Claims, 18 Drawing Sheets

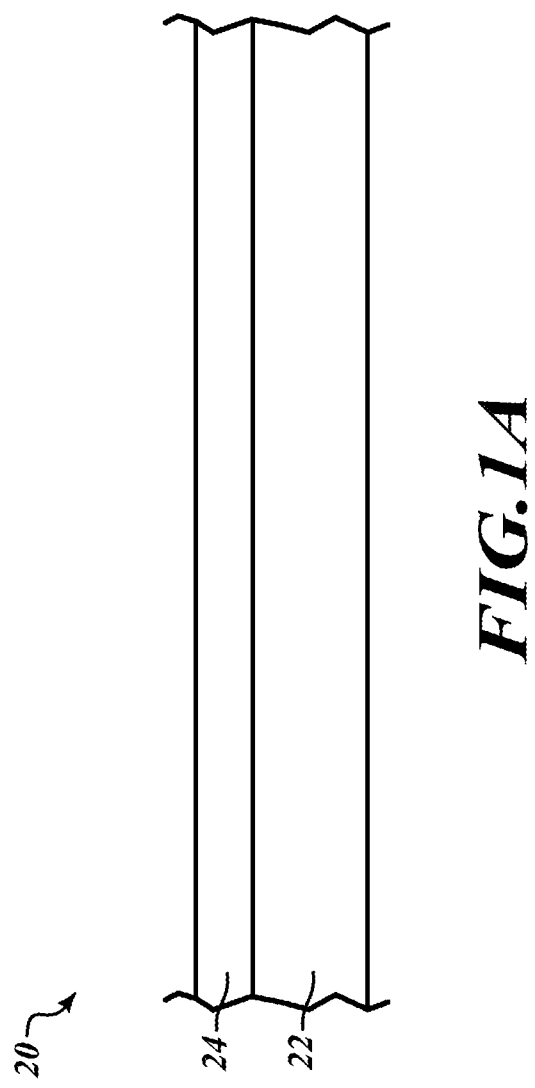

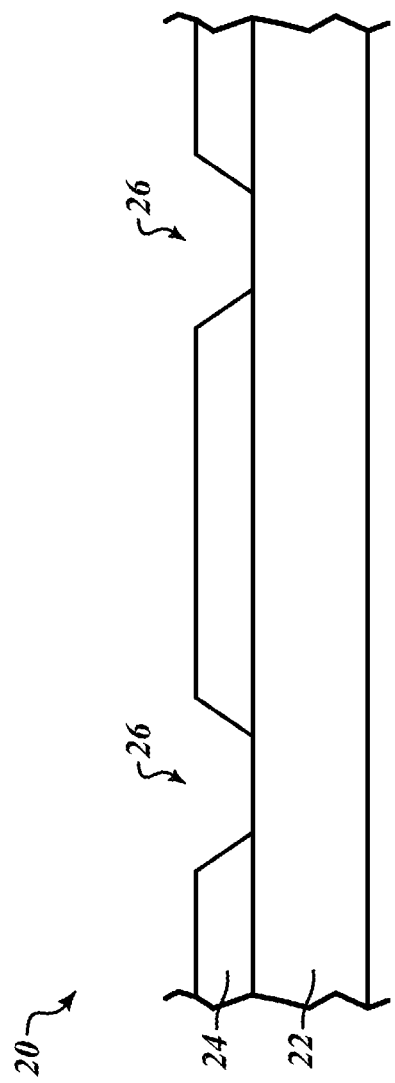

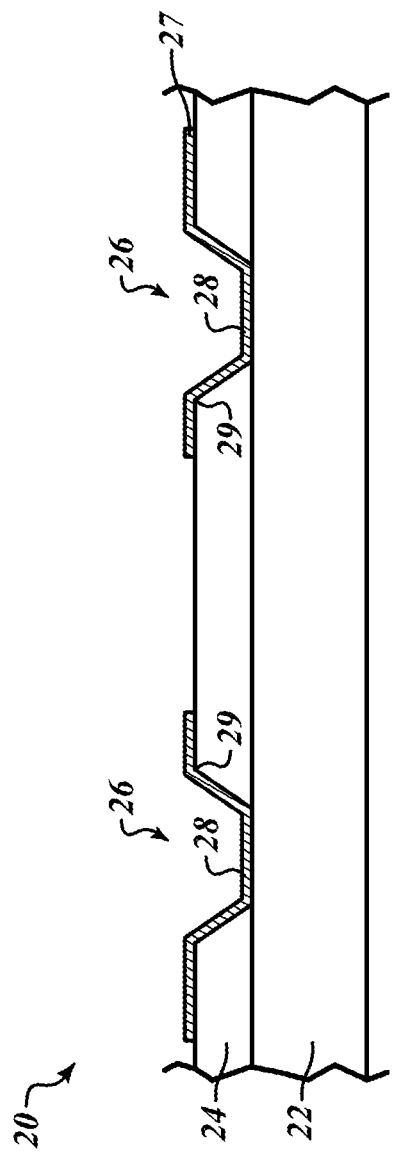

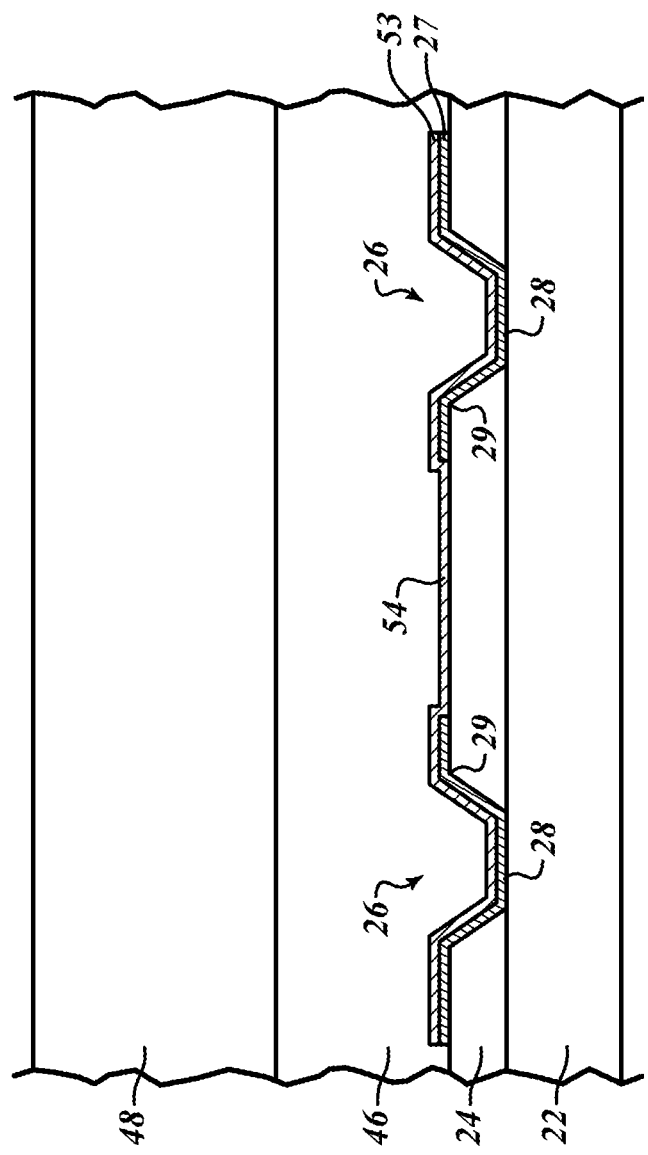

METHOD TO PROVIDE THE THINNEST AND VARIABLE SUBSTRATE THICKNESS FOR RELIABLE PLASTIC AND FLEXIBLE ELECTRONIC DEVICE

BACKGROUND

Technical Field

The present disclosure relates to electronic devices on flexible substrates. The present disclosure relates more particularly to the field of wearable electronic devices on thin flexible substrates.

Description of the Related Art

There is increasing demand for electronic devices on flexible substrates. Electronic devices which can be worn on a person's clothing in particular are implemented on flexible substrates. Typically, these flexible substrates are at least 50 μm thick. One reason for this is that high temperature processing is often required for the fabrication of devices such as amorphous silicon thin film transistors, organic materials, CMOS devices, Memristors, thin film memories, precision thin film resistors, gas sensors, temperature sensors, thin film batteries, etc.

The maximum deposition temperature is based in part on the type of flexible substrate used. For example, many kinds of flexible substrates have maximum temperature allowances of 250° C. or below. If the maximum temperature is exceeded during processing, there will be deterioration of the properties of the substrate. This deterioration can include change in curvature, shape, or other deformation.

BRIEF SUMMARY

One embodiment is a method for fabricating an electronic device including a flexible substrate. The method includes depositing a first dielectric layer on a flat substrate and opening apertures in the first dielectric layer. A first conductive layer is deposited on the first dielectric layer and on the flat substrate in the apertures. The first conductive layer is patterned to form contact pads in the apertures and signal lines on the first dielectric layer. In one embodiment, an electronic component is positioned on the first dielectric layer. Conductive terminals of the electronic component are in contact with the signal lines. Alternatively, the electronic component is formed on the first dielectric layer. Electrical terminals of the electronic device are in contact with the signal lines. A second dielectric layer is then deposited on the electronic device, the first dielectric layer, and on the first conductive layer. A third dielectric layer, which is a flexible substrate, is formed on the second dielectric layer. The electronic device is then turned over so that the flat substrate is on top of the device. The flat substrate is then peeled away from the surface of the first dielectric material and the contact pads. This leaves the electronic device having contact pads exposed on and planar with a top surface of the electronic device.

In one embodiment, the first and second dielectric layers are polyimide. The first and second dielectric layers form a polyimide seal around the electronic component, which is sandwiched between the first and second polyimide layers. The third dielectric layer is also polyimide.

In one embodiment, the electronic component is one or more thin film transistors, a thin film resistor, a capacitor, an integrated circuit die, or other type of electronic circuit.

One embodiment is a device including an electronic component on a first dielectric layer. A second dielectric layer is positioned on the electronic component and the first dielectric layer. Contact pads of a first metal layer are positioned in apertures in the second dielectric layer. Conductive signal traces of the first conductive layer are positioned between the first and second dielectric layers and electrically connect the contact pads to terminals of the electronic component. The contact pads have a top surface that is coplanar with a top surface of the second dielectric layer. The electronic component is sealed between the two dielectric layers. The first dielectric layer is a flexible substrate on which the electronic component is positioned.

One embodiment is a wearable electronic device implemented on a flexible substrate.

BRIEF DESCRIPTION OF THE SEVERAL VIEWS OF THE DRAWINGS

FIG. 1A is a cross section of an electronic device having a first dielectric layer on a substrate according to one embodiment.

FIG. 1B is a cross section of the electronic device having apertures in the first dielectric layer on a substrate according to one embodiment.

FIG. 1C is a cross section of the electronic device having a first metal layer in the apertures and on the first dielectric layer according to one embodiment.

FIG. 2B is a cross section of the electronic device having a resistor coupled between two portions of the first metal layer, a second dielectric layer on the resistor, and a third dielectric layer on the second dielectric layer.

DETAILED DESCRIPTION

Figure 1D:
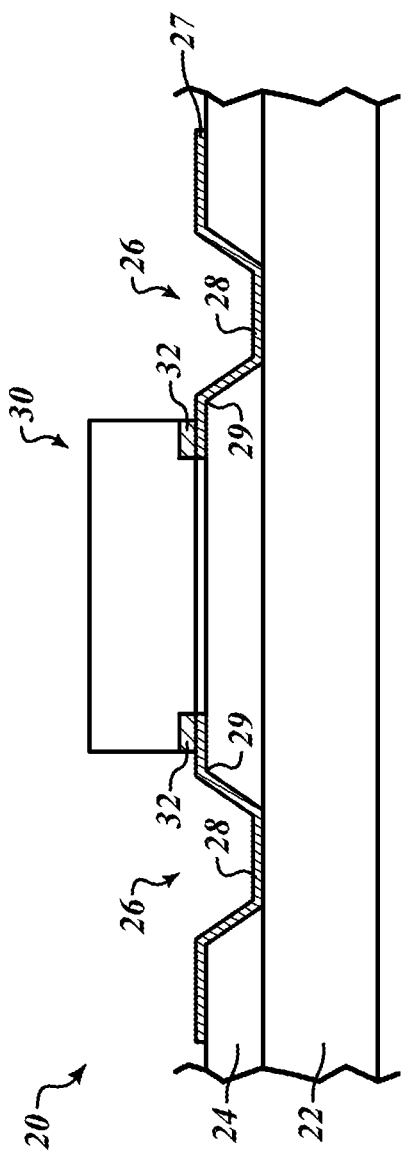
FIG. 1D is a cross section of the electronic device having an electronic component positioned on the first dielectric layer and on the first metal layer according to one embodiment.

FIG. 1A is a cross section of an electronic device 20 at an early stage of manufacture according to one embodiment. Manufacture of the electronic device 20 is begun by depositing a first layer of dielectric material 24 on a substrate 22. The first layer of dielectric material 24 is, for example, a non-photosensitive polyimide 1. The polyimide can be deposited in liquid form on the substrate 22 and spun to achieve a thickness of about 3 µm. After the polyimide has been spun, it is cured so that it hardens on the substrate 22. In this example, the substrate 22 is a rigid, non-flexible substrate, while the dielectric 24 is flexible.

The substrate 22 is, for example, glass and is 746 µm thick. Materials other than polyimide and glass can be used for the first layer of dielectric material 24 and the substrate 22. However it is desirable that the particular materials of the substrate 22 and the first layer of dielectric material 24 are selected such that the substrate 22 can be peeled away from the first layer of dielectric material 24 in a subsequent step as described further below. Both layers 22 and 24 could be flexible for example.

In FIG. 1B, apertures 26 are opened in the first layer of dielectric material 24 to expose the substrate 22 below. The apertures 26 are opened by utilizing conventional photolithography steps. For example, photoresist is formed of the first layer of dielectric material 24 and patterned to expose portions of the first layer of dielectric material 24. An etch step is then performed to etch the exposed portions of the dielectric material 24, leaving apertures 26 in the first layer of dielectric material 24.

In FIG. 1C, a first layer of conductive material 27 is deposited on the first layer of dielectric material 24 and in the apertures 26. A portion of the first layer of conductive material 27 is therefore in contact with the substrate 22 in the apertures 26. The first layer of conductive material 27 is, in one example, gold having a thickness of about 460 nm. The first layer of conductive material 27 can be deposited by physical vapor deposition (PVD), for example by sputtering, to achieve a thin layer with good step coverage in the apertures 26. The first layer of conductive material 27 is then patterned and etched using conventional photolithography methods as described above. The portions of the first layer of conductive material 27 contacting the substrate 22 in the apertures 26 are contact pads 28. Remaining portions of the first layer of conductive material 27 on the first layer of dielectric material 24 are conductive signal traces 29. In FIG. 1C, due to the nature of the cross section, only two contact pads 28 and signal traces 29 are shown, but others will be present in the device.

The first layer of conductive material 27 can be a conductive material other than gold, such as aluminum, copper, or another suitable conductive material, with the stipulation that the particular materials of the layer 24 and the substrate 22 be such that the substrate 22 can be peeled away from the contact pads 28 without damaging them, as will be explained further below.

In FIG. 1D an electronic component 30 having conductive terminals 32 has been placed on the first layer of dielectric material 24. The conductive terminals 32 of the electronic component 30 are in contact with the signal traces 29. The signal traces 29 electrically connect the conductive terminals 32 of the electronic component 30 with the contact pads 28.

In one embodiment, the electronic component 30 is an electrical circuit which has been manufactured separate from the manufacture of the electronic device 20. The electronic component 30 is, for example, an integrated circuit die, a thin film resistor, one or more thin film transistors, a capacitor, a Memristor, a battery, or any other suitable electrical component.

Because the electronic component 30 is manufactured separate from the manufacture of the electronic device 20, the temperature constraints related to manufacturing electronic devices on polyimide substrates are relaxed. In typical processes, many kinds of thin film transistors cannot be formed on flexible substrates because the deposition and/or annealing temperatures for the various process steps involved are too high. For example, the maximum deposition temperature of Kapton polyimide is 250° C. The Maximum deposition temperature of polyetheretherktone is 240° C. The maximum deposition temperature of polyethersulfone is 190° C. The maximum deposition temperature of polyetherimide is 180° C. The maximum deposition temperature of polyethylene naphthalate is 160° C. The maximum deposition temperature of polyethylene terephthalate is 120° C. Of the aforementioned substrate materials, a polyimide substrate has the highest maximum deposition temperature at 250° C. However, the deposition of some materials for thin film transistors and other electronic components requires temperatures higher than 250° C.

By placing a discreet electronic component directly on the first dielectric layer 24, some of the temperature restraints are avoided. This is because higher temperature deposition has taken place prior to placing the electronic component 30 on the first dielectric layer 24.

Figure 1E:
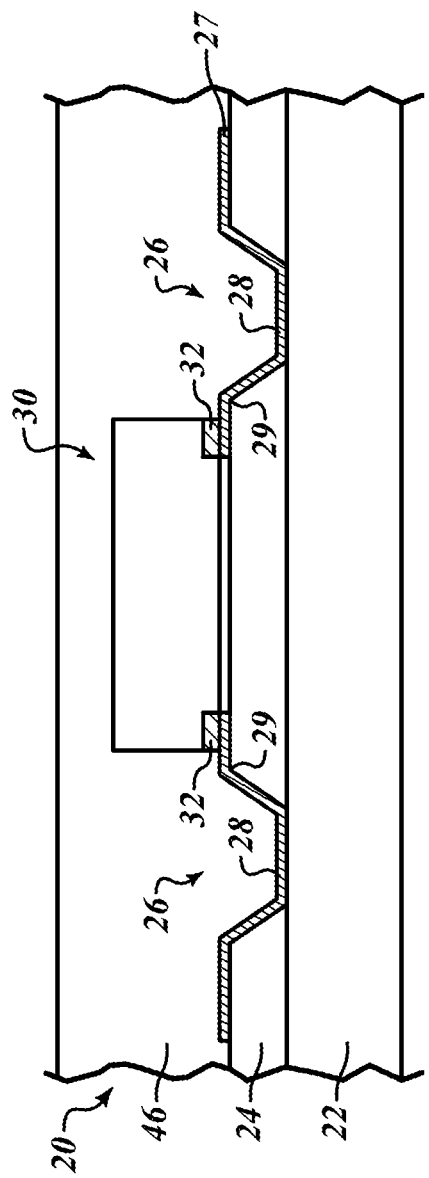
FIG. 1E is a cross section of the electronic device having a second dielectric layer positioned on the electronic component, the first metal layer, and the first dielectric layer according to one embodiment.

In FIG. 1E a second layer of dielectric material 46 is deposited on the first layer of dielectric material 24, the electronic component 30, and the first layer of conductive material 27. The second layer of dielectric material 46 is, in one example, polyimide. The second layer of dielectric material 46 can be deposited in liquid form and spun, as described previously, to form a layer about 7 µm thick. The second layer of dielectric material 46 is then hardened by curing.

Figure 1F:
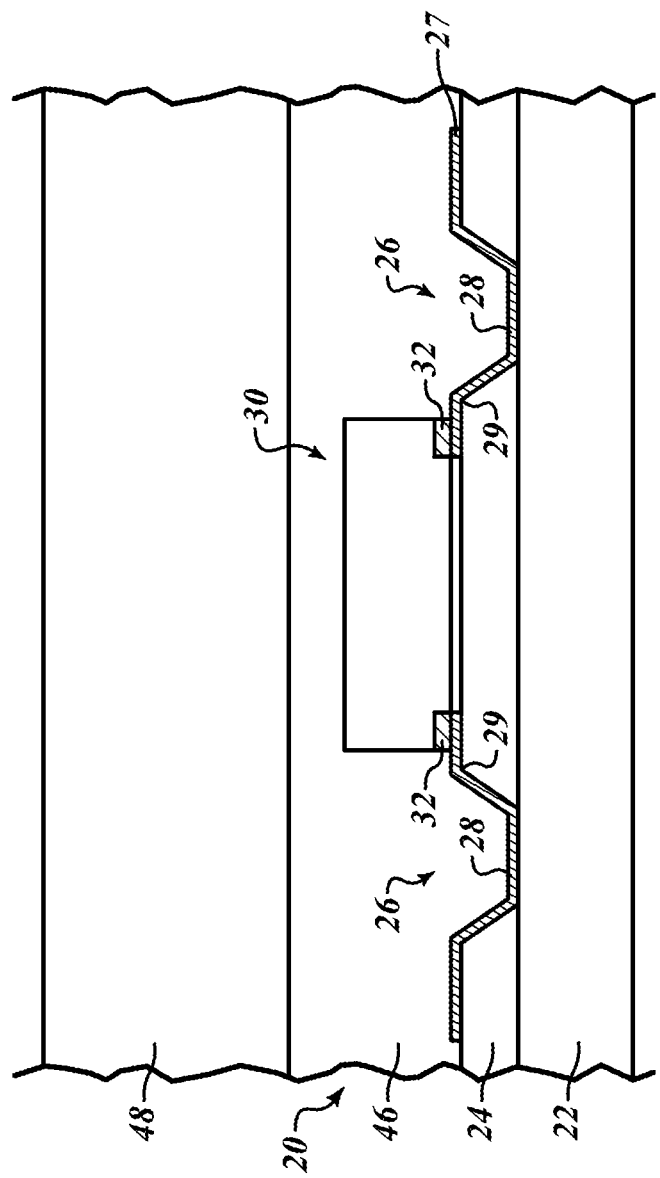
FIG. 1F is a cross section of the electronic device having a third dielectric layer on the second dielectric layer according to one embodiment.

In FIG. 1F a third layer of dielectric material 48 has been deposited on the second layer of dielectric material 46. The third layer of dielectric material 48 is, in one example, polyimide. The third layer of dielectric material 48 can be deposited in liquid form and spun, as described previously, to form a layer between 1 µm and 90 µm thick. The third layer of dielectric material 48 is then hardened by curing.

Figure 1G:
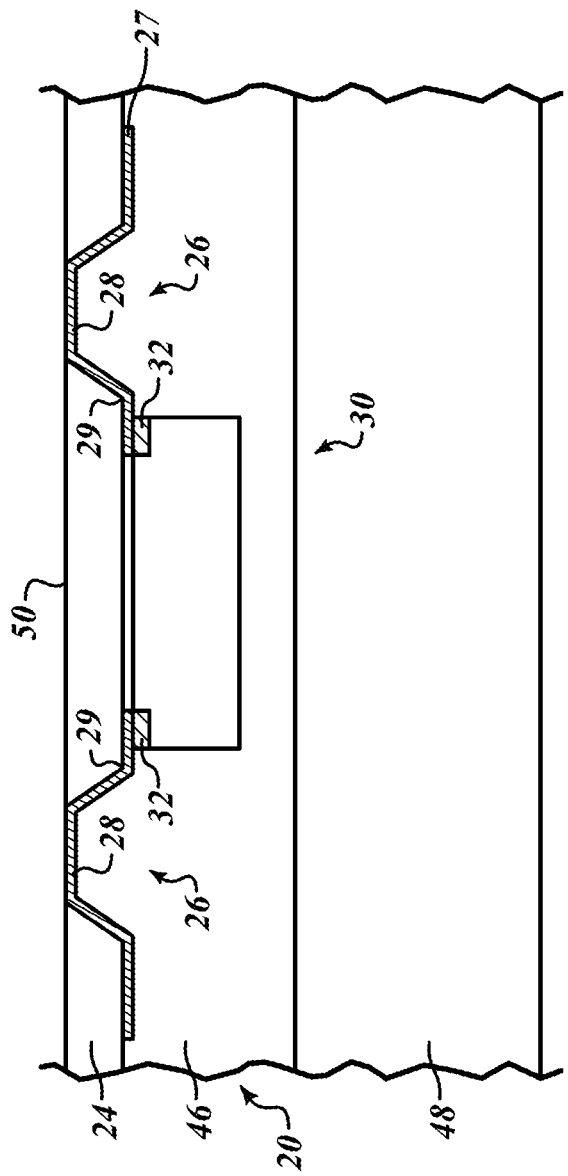
FIG. 1G is a cross section of the electronic device turned upside down and having the substrate removed.

In FIG. 1G, the electronic device 20 has been flipped over and the substrate 22 has been peeled away. The contact pads 28 are now exposed on the top layer of the electronic device 20. The surface 50 of the first layer of dielectric material 24 that was once coupled to the substrate 22 is now the top surface of the electronic device 20. Because both the first layer of dielectric material 24 and the first layer of conductive material 27 were initially deposited on the planar surface of the substrate 22, the first layer of dielectric material 24 and the contact pad 28 share a planar top surface.

The third layer of dielectric material 48 is the flexible substrate of the electronic device 20. The third layer of dielectric material 48 can be as thin or as thick as needed to satisfy the specifications of the electronic device 20. In one embodiment, the third layer of dielectric material 48 is preferably less than 10 μm thick.

Because the electronic component 30 was processed outside the presence of the flexible substrate 48, the flexible substrate 48 has not been warped or deformed in any way by higher temperature deposition processes. Because of this fact, the flexible substrate 48 does not need to be able to withstand high temperature deposition processes. The first layer of dielectric material 24 can afford to suffer some warpage in a higher temperature process because it is not the substrate which will be bonded to the surface of another device. Thus, the electronic device 20 can tolerate processes that require temperatures up to 400° C. because such processes are not performed in the presence of the main substrate 48. Instead, the substrate is deposited after processing of the electronic component 30 has been completed.

Electronic device 20 is very thin compared to previous designs in which a thick substrate was needed in order to withstand processing of an electronic component. The electronic device 20 can be as thin as 10 μm or less. Yet if desired, the electronic device 20 can be much thicker as well.

In one embodiment, the third dielectric layer 48 is not included in the electronic device 20. Instead, the second layer of dielectric material 46 is the flexible substrate. The second layer of dielectric material 46 is also deposited after the processing of the electronic component 30. The second layer of dielectric material 46 therefore does not suffer warpage or other kinds of damage during processing of the electronic component 30.

While the disclosure above has described the electronic component 30 as being placed on the first layer of dielectric material 24 after it has already been fully processed in an environment separate from the first layer of dielectric material 24, in some embodiments the electronic component 30 is processed on the first layer of dielectric material 24. The electronic component 30 can be formed on the first layer of dielectric material 24 by depositing materials on the first layer of dielectric material via chemical and physical vapor deposition processes commonly used in thin film devices. As described previously, processes up to 400° C. or higher can be used in the presence of the first layer of dielectric material 24 without causing overall damage to the device 20.

In one embodiment the electronic device 20 is a wearable electronic device which can be coupled to or implemented in an article of clothing, coupled to a person's body, coupled to or implemented in an item meant to be carried by a person, couple to merchandise from a store, etc.

Figure 2A:
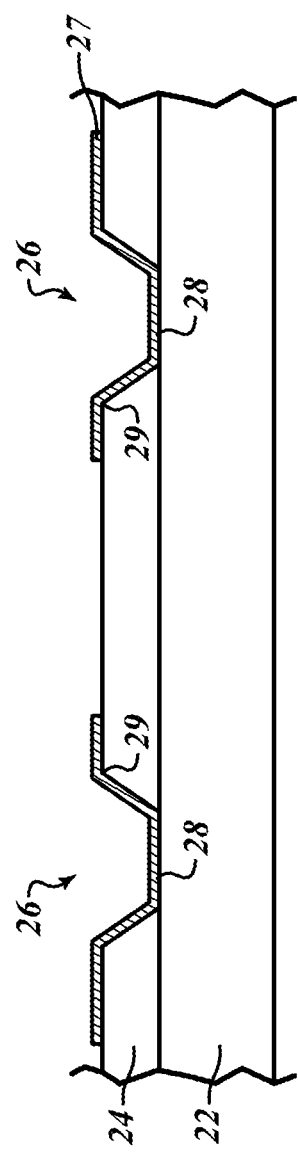
FIG. 2A is a cross section of an electronic device having a substrate, a first dielectric layer on the substrate and having apertures therein, and a first metal layer in the apertures and on the first dielectric layer according to one embodiment.

FIG. 2A is a cross section of an electronic device 20 at an early stage of manufacture according to one embodiment. In FIG. 2A the electronic device includes a substrate 22, a first layer of dielectric material 24, apertures 26 in the first layer of dielectric material 24, and a first layer of conductive material 27. The materials and processes for manufacturing the electronic device 20 as shown in FIG. 2A are substantially similar to those described in relation to FIGS. 1A-1C.

In FIG. 2B a second layer of conductive material 53 has been deposited on the first layer of dielectric material 24 and on the first layer of conductive material 27. In one example the second layer of conductive material 53 is platinum and is about 10 nm to 100 nm thick.

The second layer of conductive material 53 is deposited by physical vapor deposition process in which the material is sputtered onto the surface of the first layer of dielectric material 24 and the first layer of conductive material 27. Initially, the second layer of conductive material covers the entire exposed surface of the first layer of dielectric material 24 and the first layer of conductive material 27. After deposition, the second layer of conductive material 53 is patterned and etched to form a precision thin film resistor 54 extending between contact pads 28 shown in FIG. 2B. Though shown as a straight line in the cross section of FIG. 2B, those of skill in the art understand that the precision thin film resistor 54 may follow a winding pattern between the contact pads 28.

The thin film resistor 54 can be included in the same electronic device 20 as the electronic component 30 described with respect to FIGS. 1A-1G. Thus, though only two contact pads 28 are shown in FIG. 2B, many more contact pads 28 and signal traces 20 may be present on the surface of the first layer of dielectric material 24.

In one embodiment, electronic component 30 includes a plurality of transistors. The signal traces 29 can interconnect the transistors of the electronic component 30 with the resistor 54. Many configurations for the resistor 54 and electronic component 30 are possible as will be understood by those of skill in the art in light of the present disclosure.

After the precision thin film resistor 54 has been formed, the second and third layers of dielectric material 46, 48 are formed. The second and third layers of dielectric material 46, 48 can be formed in substantially the same manner described previously in relation to FIGS. 1A-1G.

Figure 2C:
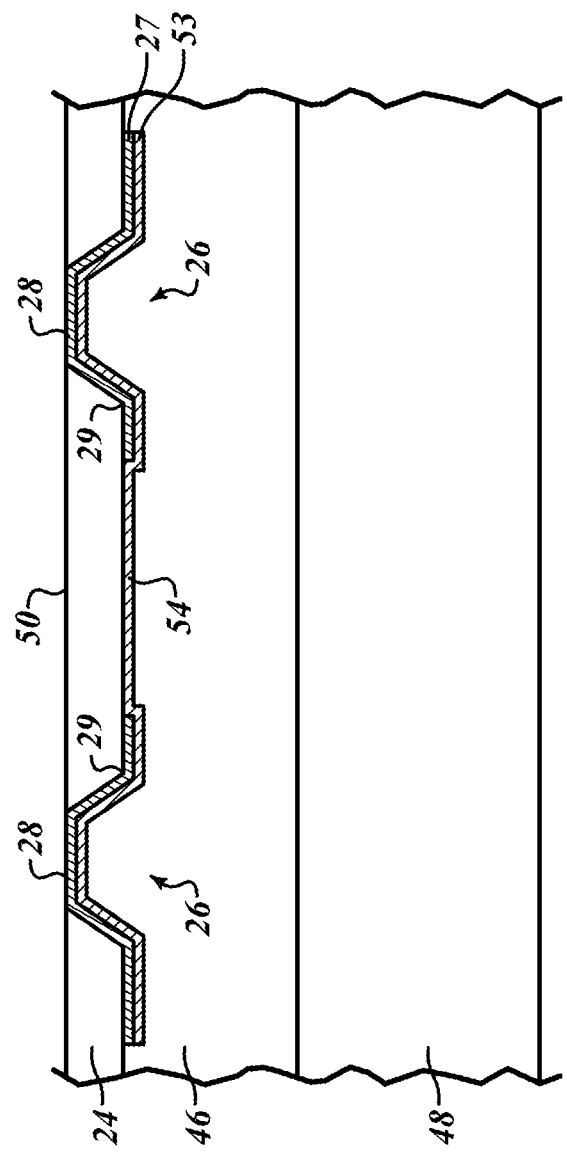
FIG. 2C is a cross section of the electronic device turned upside down and having the substrate removed.

In FIG. 2C, the device has been turned upside down and the substrate 22 has been peeled away as described previously. The contact pads 28 are exposed on the top surface 50 of the first layer of dielectric material 24. The contact pads 28 have a top surface that is planar with the top surface 50 of the first layer of dielectric material 24. The electronic device 20 of FIG. 2C enjoys the benefits of the electronic device 20 of FIG. 1G. Indeed, as described previously, electronic device 20 shown in FIG. 2C and electronic device 20 shown in FIG. 1G may be the same electronic device 20.

Figure 3A:
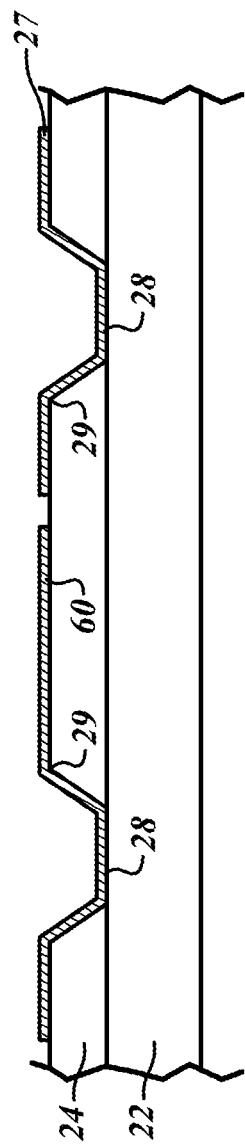
FIG. 3A is a cross section of an electronic device having a substrate, a first dielectric layer on the substrate and having apertures therein, and a first metal layer in the apertures and on the first dielectric layer according to one embodiment.

FIG. 3A is a cross section of an electronic device 20 at an early stage of manufacture according to one embodiment. In FIG. 3A the electronic device includes a substrate 22, a first layer of dielectric material 24, apertures 26 in the first layer of dielectric material 24, and a first layer of conductive material 27. The electronic device 20 of FIG. 3A also includes a terminal 60 of a capacitor. The terminal 60 is made from the first layer of conductive material 27. The terminal 60 of the capacitor is patterned at the same time that the contact pads 20 and signal traces 29 are patterned as described previously in relation to FIG. 1C. Though not shown in the cross-section of FIG. 3A, the first terminal 60 of the capacitor has a rectangular shape of a particular area as is common for thin film capacitors. The capacitance of the capacitor is based in part on the area of the first terminal 60. The terminal 60 of the capacitor is electrically connected to the left contact pad 28 shown in FIG. 3A. The materials and processes for manufacturing the electronic device 20 as shown in FIG. 3A are substantially similar to those described in relation to FIGS. 1A-1C.

Figure 3B:
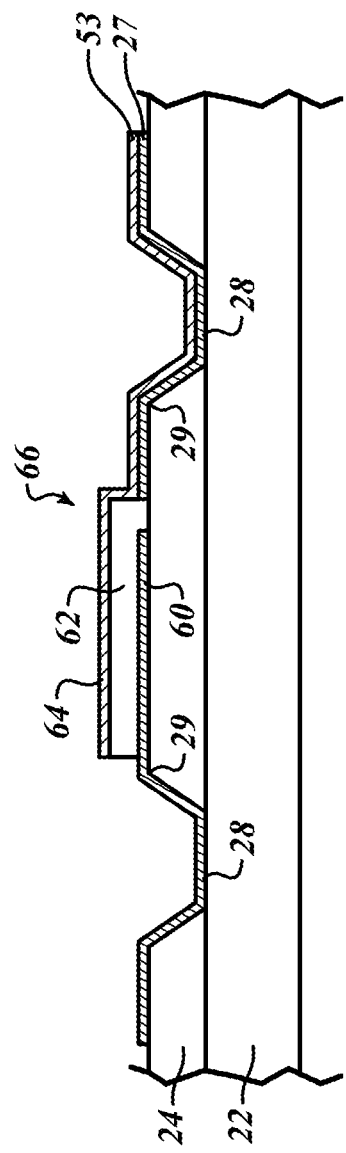
FIG. 3B is a cross section of the electronic device having a capacitor dielectric layer formed on the first metal layer and a second metal layer on the capacitor dielectric layer.
Figure 3C:
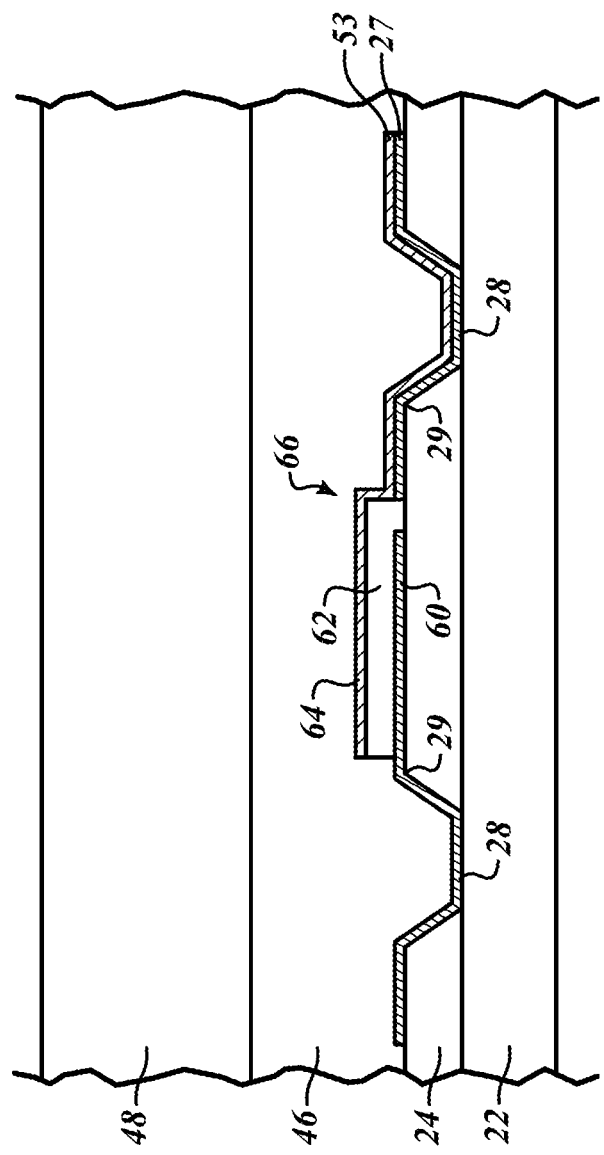
FIG. 3C is a cross section of the electronic device having a second dielectric layer on the second metal layer, and a third dielectric layer on the second dielectric layer.

In FIG. 3B, a capacitor dielectric layer 62 has been formed on the capacitor terminal 60. Capacitor dielectric layer 62 is formed by depositing a dielectric layer such as silicon nitride or silicon oxide on the capacitor terminal 60, the first layer of dielectric material 24, and the first layer of conductive material 27. The capacitor dielectric layer 62 is for example about 100 nm thick. The capacitor dielectric layer 62 is then patterned and etched using typical photolithography processes as described previously. After patterning and etching, the capacitor dielectric layer 62 remains on the capacitor terminal 60 and a portion of the first layer of dielectric material 24.

A second layer of conductive material 53 is deposited on the first layer of dielectric material 24, on the first layer of conductive material 27, and on the capacitor dielectric layer 62. In one example the second layer of conductive material 53 is platinum and is about 10 nm to 100 nm thick.

The second layer of conductive material 53 is deposited by physical vapor deposition process in which the material is sputtered onto the surface of the first layer of dielectric material 24 and the first layer of conductive material 27. Initially, the second layer of conductive material covers the entire exposed surface of the first layer of dielectric material 24 and the first layer of conductive material 27. After deposition, the second layer of conductive material 53 is patterned and etched to form a capacitor plate 64 electrically connected to the contact pad 28 on the right side of FIG. 3B. Though shown as a straight line in the cross section of FIG. 3B, those of skill in the art understand that the capacitor plate 64 has an area similar to the capacitor plate 60. The capacitor plate 60, the capacitor dielectric layer 62, and the capacitor plate 64 form a capacitor 66. The voltage can be applied across the terminals 60 and 64 of the capacitor 66 via the contact pads 28.

In one embodiment, the capacitor 66 is formed together with the resistor 54. In particular, the capacitor terminal 64 is made from the same second layer of conductive material 53 as the resistor 54. When the resistor 54 is patterned and etched, the capacitor terminal 64 is also patterned and etched. The resistor 54 and the capacitor 66 can be included in the same electronic device 20 as the electronic component 30.

After the capacitor 66 has been formed, the second and third layers of dielectric material 46, 48 are formed. The second and third layers of dielectric material 46, 48 can be formed in substantially the same manner described previously in relation to FIGS. 1A-1G.

Figure 3D:
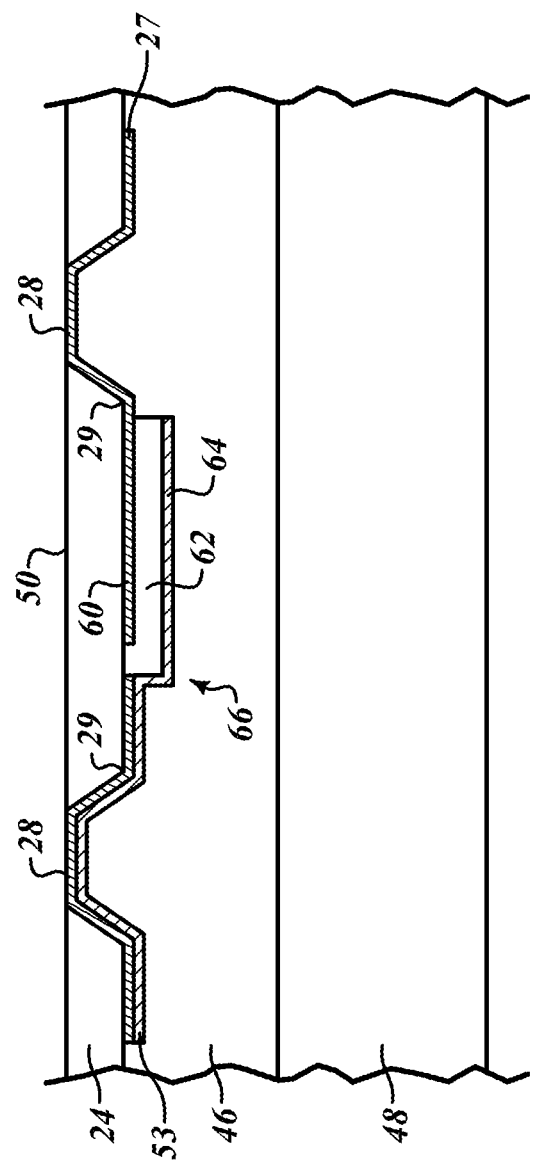
FIG. 3D is a cross section of the electronic device turned upside down and having the substrate removed.

In FIG. 3D, the device been turned upside down and the substrate 22 has been peeled away as described previously. The contact pads 28 are exposed on the top surface 50 of the first layer of dielectric material 24. The contact pads 28 have a top surface that is planar with the top surface 50 of the first layer of dielectric material 24. The electronic device 20 of FIG. 3D enjoys the benefits described with respect to the electronic device 20 of FIG. 1G.

Figure 4A:
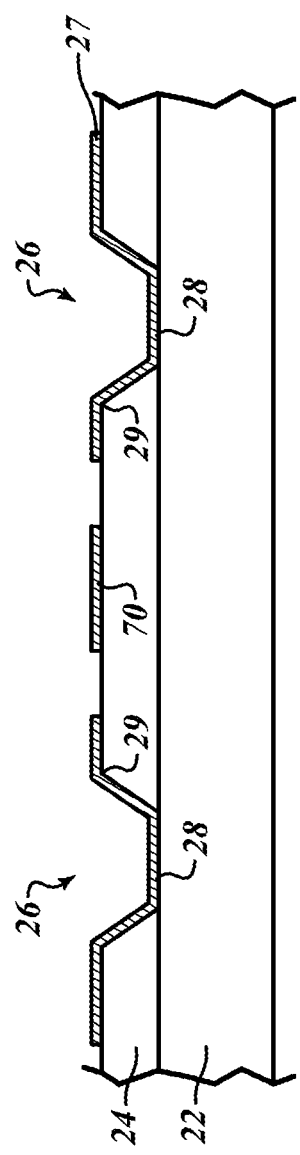
FIG. 4A is a cross section of an electronic device having a substrate, a first dielectric layer on the substrate and having apertures therein, and a first metal layer in the apertures and on the first dielectric layer according to one embodiment.

FIG. 4A is a cross section of an electronic device 20 at an early stage of manufacture according to one embodiment. In FIG. 4A the electronic device includes a substrate 22, a first layer of dielectric material 24, apertures 26 in the first layer of dielectric material 24, and a first layer of conductive material 27. The electronic device 20 of FIG. 4A also includes a gate electrode 70 as described in more detail below. The gate electrode 70 is made from the first layer of conductive material 27. The gate electrode 70 is patterned at the same time that the contact pads 20 and signal traces 29 are patterned as described previously in relation to FIG. 1C. The materials and processes for manufacturing the electronic device 20 as shown in FIG. 3A are substantially similar to those described in relation to FIGS. 1A-1C.

Figure 4B:
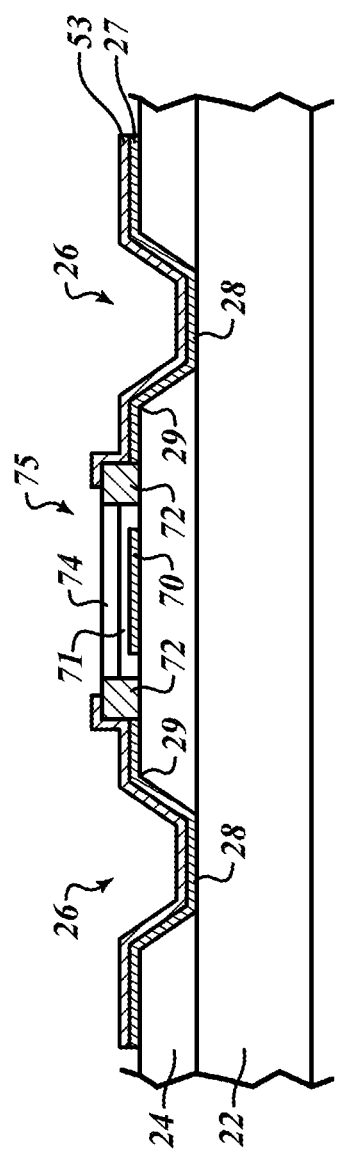
FIG. 4B is a cross section of the electronic device having a transistor positioned on the first dielectric layer and on the first metal layer according to one embodiment.
Figure 4C:
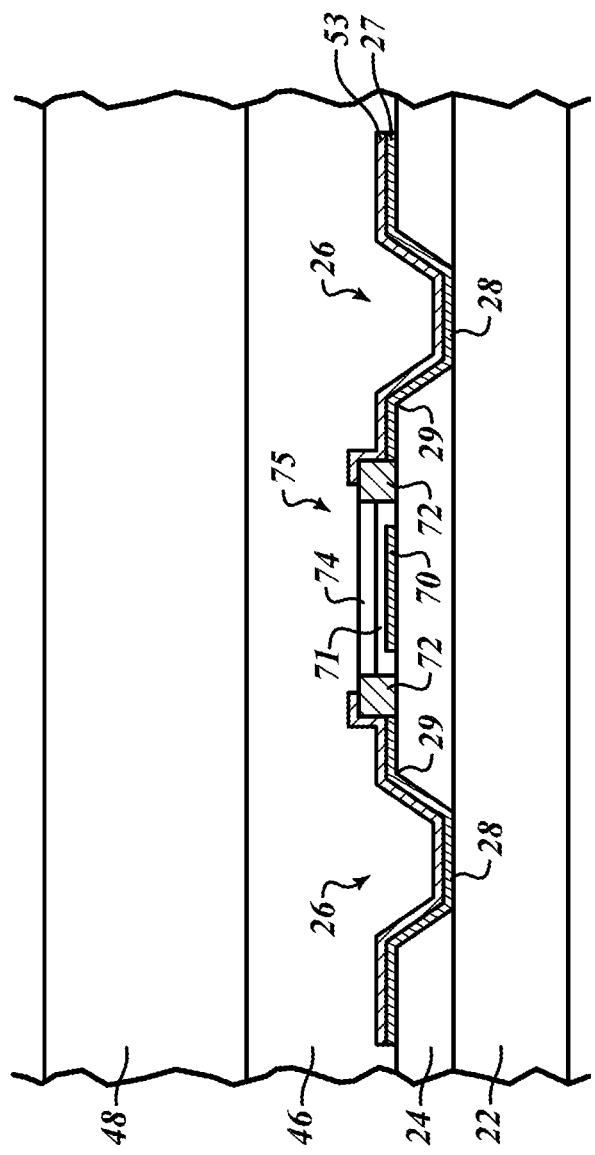
FIG. 4C is a cross section of the electronic device having a second dielectric layer on the transistor and the first dielectric layer, and a third dielectric layer on the second dielectric layer according to one embodiment.

In FIG. 4B a transistor 75 has been formed on the gate electrode 70 and the first layer of dielectric material 42. The transistor 75 includes a gate dielectric 71 on the gate electrode 70. Source and drain regions 72 are formed adjacent the signal traces 29. The channel region 74 is adjacent the source and drain regions 72 and the gate dielectric 71.

After patterning the first layer of conductive material 27, a dielectric material, for example silicon oxide, is deposited on the gate electrode 70, the first layer of dielectric material 24, and exposed portions of the first layer of conductive material 27. The dielectric material is then patterned and etched using common photolithographic techniques. After the dielectric material has been etched, only the gate dielectric 71 remains on the gate electrode 70. The gate dielectric 71 is, for example, 100 nm thick.

In one embodiment, the gate dielectric 71 is formed of the same material and in the same process steps as the capacitor dielectric 62 described previously. The thin film transistor 75 can therefore be formed in a single electronic device 20 together with the resistor 54, the capacitor 66, and the electronic component 30.

After the gate dielectric 71 has been formed, a layer of amorphous silicon is formed adjacent the gate dielectric 71. After the amorphous silicon has been formed, source and drain regions 72 are formed in the amorphous silicon by implanting dopant ions into the source and drain regions 72 of the amorphous silicon in the presence of a mask. The dopant ions can be any suitable ions for doping the source/drain of a transistor with N or P conductivity type as is well known in the art. The mask is then removed and the amorphous silicon is patterned and etched to leave amorphous silicon only adjacent the gate dielectric 71. In particular, the amorphous silicon is positioned on the first layer of dielectric material 24 between the gate dielectric and the signal lines 29, as well as on top of the gate dielectric 71. The undoped portion of the remaining amorphous silicon is the channel region 74 of the transistor 75.

A second layer of conducting material 53 is then formed on the exposed portions of the first layer of conductive material 42, on the first layer of dielectric material 24, and on the transistor 75. The second layer of conductive material 53 is for example platinum with a thickness of about 100 nm. The second layer of conductive material 53 is then patterned and etched, leading portions of the second layer of conductive material on the exposed portions of the first layer of conductive material and on the source and drain regions 72 of the transistor 75. The presence of the second layer of conductive material 53 on the source and drain regions 72 allows for improved electrical connection with the source and drain regions 72. In one embodiment, the second layer of conductive material 53 is patterned at the same time as the capacitor plates 64 and the thin film resistor 54 as described previously.

The transistor 75 operates in a similar manner as typical transistors. In particular, when a voltage is applied between the source and drain regions 72, the channel region 74 can be rendered conductive or nonconductive by applying a voltage to the gate electrode 70. For an N-channel thin film transistor 75, applying a high voltage to the gate electrode 72 will turn on the transistor 75. Applying a low voltage to the gate electrode 70 will turn off the transistor 75.

Because the amorphous silicon of the transistor 75 has been deposited without the presence of the second or third dielectric layers 46, 48, the higher temperatures used in forming the amorphous silicon do not significantly damage the electronic device 20. In this way, higher temperature processes can be used to form thin film transistor 75 of amorphous silicon or of other suitable materials.

While a single thin film transistor 75 is shown in FIG. 4B, the electronic device 20 can include many thin film transistors 75 as will be understood by those of skill in the art in light of the present disclosure. Likewise, though not shown in FIG. 4B, the gate electrode 70 is connected by a signal trace 29 to another contact pad 28 out of the plane of the cross section of FIG. 4B.

After the thin film transistor 75 has been formed, the second and third layers of dielectric material 46, 48 are formed. The second and third layers of dielectric material 46, 48 can be formed in substantially the same manner described previously in relation to FIGS. 1A-1G.

Figure 4D:
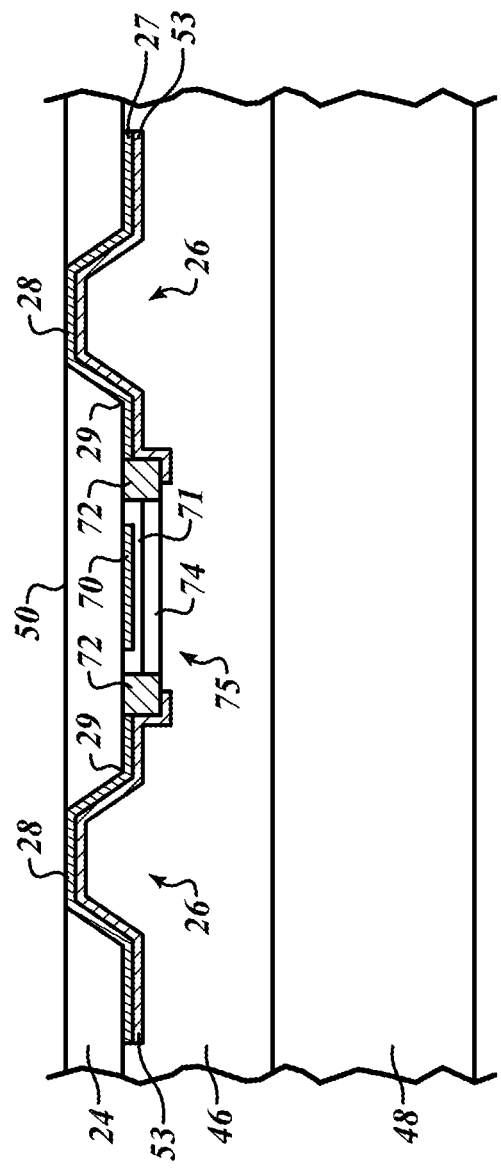
FIG. 4D is a cross section of the electronic device turned upside down and having the substrate removed according to one embodiment.

In FIG. 4D, the device been turned upside down and the substrate 22 has been peeled away as described previously. The contact pads 28 are exposed on the top surface 50 of the first layer of dielectric material 24. The contact pads 28 have a top surface that is planar with the top surface 50 of the first layer of dielectric material 24. The electronic device 20 of FIG. 4D enjoys the benefits described with respect to the electronic device 20 of FIG. 1G.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
depositing a first dielectric layer on a substrate;
forming a plurality of apertures in the first dielectric layer;
depositing a first metal layer on the first dielectric layer and in the apertures;
forming a first and a second contact pad in the apertures from the first metal layer;
positioning an electronic device on the first dielectric layer in electrical connection with the first and second contact pads;
depositing a second dielectric layer on the first dielectric layer and the electronic device; and
removing the substrate from the first dielectric layer.

2. The method of claim 1 comprising forming a third dielectric layer on the second dielectric layer.

3. The method of claim 1 wherein the first dielectric layer is polyimide.

4. The method of claim 3 wherein the second dielectric layer is polyimide.

5. The method of claim 1 wherein the first metal layer is gold.

6. The method of claim 1 wherein the electronic device is an integrated circuit die.

7. The method of claim 1 wherein the electronic device includes an amorphous silicon thin film transistor.

8. The method of claim 7 wherein first metal layer includes a gate contact in contact with a gate electrode of the thin film transistor.

9. The method of claim 1 wherein the electronic device is a thin film memory.

10. The method of claim 1 wherein the second dielectric layer is less than 10 µm thick.

11. A method comprising:
depositing a first dielectric layer on a surface of a substrate;
opening a plurality of apertures in the first dielectric layer;
depositing a first conductive layer on the first dielectric layer and in the apertures;
defining contact pads in the apertures and signal lines from the first conductive layer by patterning and etching the first conductive layer;
positioning an electronic device on the first dielectric layer with a terminal of the electronic device in contact with one of the signal lines;
depositing a second dielectric layer on the electronic device and on the first dielectric layer; and
removing the substrate from the first dielectric layer and the contact pads.

12. The method of claim 11 comprising depositing a third dielectric layer on the second dielectric layer.

13. The method of claim 12 wherein the first, second and third dielectric layers have a combined thickness less than 20 µm thick.

14. The method of claim 11 wherein the first and second dielectric layers are polyimide.

15. The method of claim 11 comprising:
forming a first capacitor electrode of the first conductive layer by patterning and etching the first conductive layer;
forming a third dielectric layer on the first capacitor electrode prior to depositing the second dielectric layer;
depositing a second conductive layer on the third dielectric layer and on one of the signal lines; and
forming a second capacitor electrode of the second conductive layer on the third dielectric layer by patterning and etching the second conductive layer prior to depositing the second dielectric layer.

16. The method of claim 11 comprising:
depositing a second conductive layer on the first dielectric layer, two of the signal lines, and the dielectric layer; and
forming a resistor from the second conductive layer between two of the signal lines by patterning and etching the second conductive layer.

17. A method comprising:
depositing a first dielectric layer on a surface of a substrate;
forming a plurality of apertures in the first dielectric layer;
depositing a first conductive layer on the first dielectric layer and in the apertures;
defining contact pads in the apertures, a plurality of signal lines, and a first capacitor electrode from the first conductive layer by patterning and etching the first conductive layer;
depositing a second dielectric layer on the first capacitor electrode;
depositing a second conductive layer on the second dielectric layer and on one of the signal lines;
defining a second capacitor electrode on the second dielectric layer from the second conductive layer by patterning and etching the second conductive layer; and
removing the substrate from the first dielectric layer and the contact pads.

18. The method of claim 17 comprising depositing a third dielectric layer on the second dielectric layer.

19. The method of claim 17 comprising wherein the first, second and third dielectric layers have a combined thickness less than 20 µm thick.

20. The method of claim 17 wherein the first and second dielectric layers are polyimide.

* * * * *